United States Patent [19]

Karr

[11] Patent Number: 5,038,405
[45] Date of Patent: Aug. 6, 1991

[54] TUNABLE ANTENNA APPARATUS AND METHOD FOR USE WITH SUPERHETERODYNE RECEIVERS

[76] Inventor: Lawrence J. Karr, 445 15th St., Santa Monica, Calif. 90402

[21] Appl. No.: 538,263

[22] Filed: Jun. 14, 1990

[51] Int. Cl.⁵ ............................................. H04B 1/18
[52] U.S. Cl. .................................. 455/197; 455/193; 455/289; 343/745
[58] Field of Search ............... 455/193, 195, 196, 197, 455/269, 270, 293, 2, 132, 317, 169; 343/745, 702, 766

[56] References Cited

U.S. PATENT DOCUMENTS

| | | | |
|---|---|---|---|
| 2,896,070 | 7/1959 | Fremont et al. | 455/2 |
| 3,299,355 | 1/1967 | Jenks et al. | 455/2 |
| 3,372,337 | 3/1968 | Beres | 455/289 |
| 3,626,300 | 12/1971 | Kennedy | 325/388 |
| 4,085,366 | 4/1978 | Padgett | 325/22 |
| 4,138,654 | 2/1979 | Luhowy | 334/55 |
| 4,204,166 | 5/1980 | Araki | 455/289 |
| 4,339,827 | 7/1982 | Torres et al. | 455/188 |

FOREIGN PATENT DOCUMENTS

2033179 4/1980 United Kingdom ................ 343/766

Primary Examiner—Reinhard J. Eisenzopf
Assistant Examiner—Edward Uroan
Attorney, Agent, or Firm—Roy J. Mankovitz

[57] ABSTRACT

An antenna tuning system and method are disclosed for use with a tunable receiver coupled to an external antenna, where the receiver has a local oscillator whose frequency is a function of the frequency to which the receiver is tuned. The tuning system includes circuitry for receiving the radio frequency emissions from the local oscillator, and for determining the frequency of those emissions. From the local oscillator frequency, the frequency to which the receiver is tuned is determined, and the antenna is tuned to match that frequency.

10 Claims, 5 Drawing Sheets

TUNABLE ANTENNA APPARATUS AND METHOD FOR USE WITH SUPERHETERODYNE RECEIVERS

BACKGROUND OF THE INVENTION

This invention relates to antenna tuning circuits and, more particularly, to an automatic antenna tuning circuit for indoor use with convnetional FM and television receivers.

Over the years, a wide variety of antennas have been developed for use with conventional FM and television receivers. These antenna designs range from large outdoor multi-element dipole antennas to small folded dipole and loop-type indoor antennas. One problem with prior art indoor antennas is that, as a result of their small size, they possess a very high Q, and consequently a very narrow bandwidth. Typically, these antennas are sized for optimum performance in the center of the receiver bandwidth. As a result of their narrowband characteristics, these antennas provide poor performance on either side of that center frequency. Some indoor antennas have elements which are manually adjustable in size, but such adjustments are difficult to accomplish with any degree of accuracy, and must be changed for each change in receiver frequency.

Accordingly, it is an object of the present invention to provide a new antenna tuning system which improves the performance of small antennas.

It is another object of the present invention to provide an antenna tuning system which can be used with conventional FM and television receivers without any modifications thereto, and which is completely automatic in its operation.

SUMMARY OF THE INVENTION

The foregoing and other objects of the invention are accomplished by providing antenna tuning apparatus for use with a conventional tunable receiver connectable to an external antenna. The receiver is of the type which produces a local oscillator signal whose frequency is functionally related to the frequency to which the receiver is tuned.

The tuning apparatus includes local oscillator signal receiver circuits for receiving radio frequency emissions produced by the local oscillator signal. Frequency determining circuitry is also provided which is responsive to the local oscillator signal receiver for determining the frequency of the local oscillator signal.

Antenna tuning circuitry is provided which responds to the frequency determining circuitry, and employs the functional relationship between the local oscillator frequency and the frequency to which the receiver is tuned, to tune the antenna to substantially the same frequency as that to which the receiver is tuned.

An antenna tuning method is also disclosed for use with a tunable receiver connectable to an external antenna, where the receiver is of the type which produces a local oscillator signal whose frequency is functionally related to the frequency to which the receiver is tuned. The method includes the steps of receiving, from a point external to the receiver, radio frequency emissions produced by the local oscillator signal; determining the frequency of the local oscillator signal from the emissions; and tuning the antenna to substantially the same frequency as that to which the receiver is tuned by responding to the frequency of the local oscillator signal, and employing the functional relationship between the local oscillator frequency and the frequency to which the receiver is tuned.

Other objects, features and advantages of the invention will become obvious from a reading of the specification in conjunction with the drawings, in which like reference designators refer to like elements throughout the several views.

DESCRIPTION OF THE PREFERRED EMBODIMENTS

Figure 1:
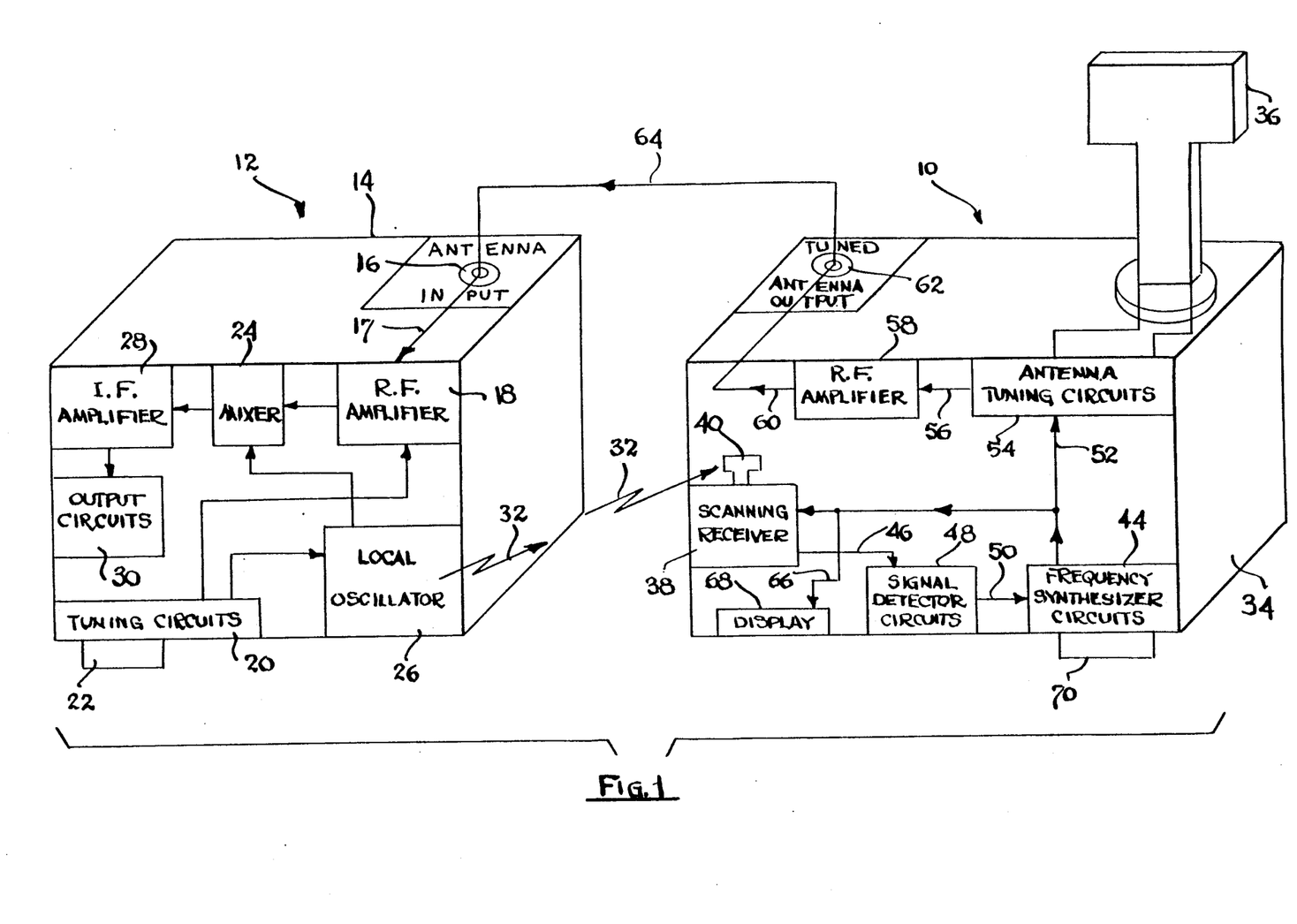
FIG. 1 is a functional block diagram of a first embodiment of the invention, showing the functions of the various elements and their interaction with a conventional receiver.

Referring to FIG. 1, there is shown a block diagram of a first embodiment 10 of the automatic antenna tuning system of the invention connected to a conventional FM receiver 12 so as to provide the function of a tuned external antenna. While the following description of the invention shows its operation in connection with a conventional FM receiver, this is for the purpose of example only. As will become apparent, the invention is by no means limited to such use, and is equally well adapted for use with other receivers such as television receivers.

The types of receivers with which the invention is designed to operate are those which employ a local oscillator as part of their circuitry. These types of receivers generally employ a circuit design usually referred to as superheterodyne. This design is well known in the art and is by far the most popular in use for commercial receivers. The following is a brief description of the operation of a suprheterodyne receiver, with reference to the receiver 12 in FIG. 1.

The receiver 12 includes a cabinet 14 on the exterior of which is mounted an antenna input terminal 16 designed to be connected to an external antenna. A conventional external antenna designed for indoor use is the folded dipole, which may take the form of a predetermined length of antenna cable terminated at both ends, and connected at its center point to the receiver input terminal 16. The terminal 16 is in turn connected via line 17 to the input of a broad band RF amplifier 18 which is tuned by the user to the desired station frequency by suitable tuning circuits 20 using a tuning control element 22. In receivers employing digital tuning circuitry, the element 22 is generally a pushbutton, while in receivers employing analog tuning circuitry, the element 22 is generally a tuning knob. The present invention is suitable for use with either type of tuning circuitry.

The output signal from amplifier 18 is provided as an input signal to a mixer circuit 24, where it is mixed with the output signal from a local oscillator 26. The local oscillator 26 is also tuned by the tuning circuits 20 such that the frequency of the oscillator 26 is the sum of the tuned station frequency and a fixed frequency known as the intermediate frequency. By convention, the value of the intermediate frequency for FM receivers is 10.7 megahertz (Mhz). The output signal from the mixer 24 is thus a 10.7 megahertz signal carrying the modulation of the received RF signal. The output signal from the mixer 24 is provided as an input signal to an intermediate frequency (I.F.) amplifier 28. The output signal from the amplifier 28 is provided as an input signal to suitable output circuits 30 which generally perform the functions of demodulation, filtering and audio amplification. The resultant audio signal is then provided to either internal or external audio speakers or headphones (not shown).

From the above description, it may be seen that the frequency of the local oscillator 26 is functionally related to the tuned frequency of the receiver 12, and is in fact the sum of the tuned frequency and the constant I.F. frequency. The inventor has discovered that the signal generated by the local oscillator in a majority of the commercially produced receivers is of sufficient signal strength so that as a result of radiated emissions therefrom (represented by arrows 32 in FIG. 1) that signal may be detected by a suitable receiver located in the area adjacent the receiver cabinet 14.

The present invention makes use of this phenomenon to externally determine the frequency to which the receiver 12 is tuned, and to use that information to tune an external antenna to that same frequency. The signal from the tuned antenna is provided to the receiver 12 antenna input terminal 16. As a result of the tuned antenna, the signal reception performance of the receiver 12 is vastly improved over that achieved using a conventional untuned external antenna. The following is a description of the operation of the automatic antenna tuning system 10.

The system 10 includes an enclosure 34 suitable for housing the circuitry to be described, as well as supporting a tunable antenna 36 which, in the preferred embodiment is constructed as a vertical loop antenna. Within the enclosure 34, which is positioned in close proximity to the cabinet 14 of the receiver 12, is a scanning receiver 38 to which is connected a small antenna 40 which may be of the loop type. The receiver 38 is used in conjunction with antenna 40 to receive the signal 32 radiated by oscillator 26 and hence is designed to be tunable over a frequency range encompassing the frequency range of the signal generated by the local oscillator 26.

In the United States, the nominal FM frequency band is 88 to 108 Mhz. Accordingly, the frequency range of the local oscillator 26 signal extends from 98.7 to 118.7 Mhz. The receiver 38 is tuned in response to tuning signals provided on line 42 from frequency synthesizer circuits 44. The circuits 44 provide a series of tuning signals designed to scan sequentially the frequency range of the local oscillator 26 to detect the local oscillator signal which, as stated above, is related to the frequency of the station to which the receiver 12 is tuned.

In the United States, the FM stations are spaced apart 0.2 Mhz, at odd intervals thereof (e.g. 88.1, 88.3, 88.5 Mhz, etc.). When the intermediate frequency of 10.7 Mhz is added thereto, the result is that the local oscillator signals corresponding to these stations are also spaced apart 0.2 Mhz, but at even intervals thereof (98.8, 99.0, 99.2 Mhz, etc.). Accordingly, the tuning signals generated by circuits 44 are set to correspond to these even intervals. The receiver 38 is configured to have a narrow bandwidth which operates in conjunction with the spaced apart tuning signals from the circuits 44 to enable the receiver to reject spurious signals not corresponding in frequency to any one of the expected frequencies generated by the oscillator 26.

Signals recevied by receiver 38 are provided on line 46 to signal detector circuits 48, which use several criteria to determine if the received signal is from the local osciallator 26. The criteria include an analysis of the frequency and the energy of the received signal. If that criteria is met, the signal detector circuits 48 provide on line 50 a signal to the circuits 44 to stop their scanning and hold the last frequency as corresponding to the frequency of the station to which the receiver 12 is tuned. If that criteria is not met, the circuits 44 continue to direct the receiver 38 to tune across the band.

The tuning signal generated by the frequency synthesizer circuits 44 is also provided on line 52 to antenna tuning circuits 54. The circuits 54 scale the tuning signal by subtracting from it the intermediate frequency value (10.7 Mhz), to produce an antenna tuning signal representing the station frequency corresponding to the oscillator 26 frequency being scanned by the receiver 38. This antenna tuning signal is employed by the circuits 54 to tune the antenna 36 to that station frequency. The output signal from the thus tuned antenna 36 is provided on line 56 to an RF amplifier 58 where it is amplified and suitably buffered.

The output signal from the amplifier 58 is applied via line 60 to a tuned antenna output terminal 62 mounted on the enclosure 34. The terminal 62 is connected to the antenna input terminal 16 of receiver 12 using a cable 64. The tuning signal generated by the circuits 44 is also applied via line 66 to a digital display 68. Circuits associated with the display 68 scale the tuning signal (by subtracting the I.F. frequency) so that the oscillator 26 frequency being scanned by the receiver 38. The circuitry thus described may be powered by batteries or other suitable means (not shown).

The operation of the automatic antenna tuning apparatus 10 described above is as follows. The user tunes the receiver 12 to the desired station using tuning element 22. For purposes of example, assume the station frequency to be 101.3 Mhz. The scanning receiver 38, in response to the tuning signal from circuits 44, tunes over the frequency range of the local oscillator 26 at even increments of 0.2 Mhz. When the receiver 38 is tuned to 112 Mhz (101.3+10.7 Mhz), it receives via the antenna 40 the radiated emissions 32 from the local oscillator 26, and provides a detection signal on the line 46 to the detector circuits 48.

The circuits 48, via the pre-established criteria, confirm the presence of the oscillator signal and cause the frequency synthesizer circuits 44 to stop scanning and to hold the present tuning signal frequency value of 112 Mhz. This same tuning signal, via the line 52 and the antenna tuning circuits 54, acts to tune the antenna 36 to the station frequency of 101.3 Mhz, which is shown on the display 68. The tuned antenna output signal is provided via amplifier 58, terminal 62, and cable 64 to the antenna input terminal 16 of receiver 12. As a result of the tuning of the antenna 36 to the frequency (101.3 Mhz) being broadcast by the radio station, the receiver 12 is provided with a strong station signal which results in reception performance which is substantially better than that obtained from the use of conventional untuned antennas.

When the user changes stations on the receiver 12, the narrowband scanning receiver 38 loses reception of the local oscillator 26 signal. This event is detected by circuits 48, which cause the frequency synthesizer circuits 44 to begin their scanning function. The scanning continues until the receiver 38 locks on to the frequency of the local oscillator 26 signal corresponding to the newly tuned station. Following the steps described above, it will be seen that the antenna 36 will then be correctly tuned to the frequency of this new station.

The antenna tuning apparatus 10 also includes a calibration function which is instituted by actuating a calibration switch 70 mounted on the enclosure 34. This function acts to adjust the circuits 44 to account for variations in the I.F. frequency of the receiver 12 from the nominal value of 10.7 Mhz. It has been found in practice that the actual value of the I.F. frequency in commercially produced receivers can vary by as much as 50 kilohertz (Khz) form the desired value of 10.7 Mhz. The operation of the calibration function will be discussed in detail below in connection with the schematic diagram of FIG. 3.

While the operation of the antenna tuning apparatus 10 is quite satisfactory for most installations, the placement of the enclosure 34 is restricted to be in relatively close promimity to the cabinet 14 of the receiver 12 in order to ensure the reception of a local oscillator signal of sufficient signal strength for detection by the receiver 38. This placement restriction is overcome by a second embodiment of the invention 80 shown in FIG. 2.

Figure 2:
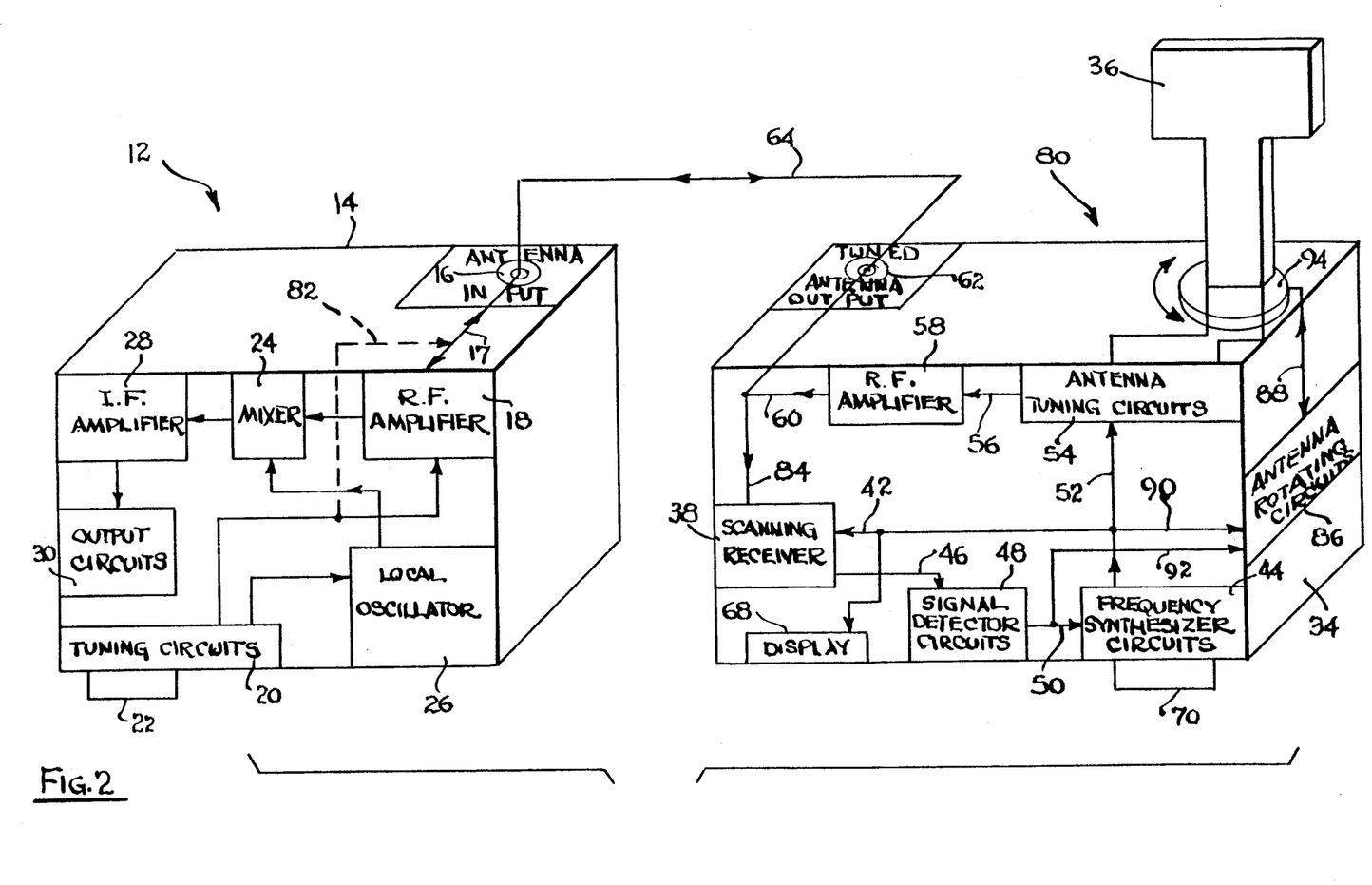
FIG. 2 is a functional block diagram of a second embodiment of the invention, showing the functions of the various elements and their interaction with a conventional receiver.

Referring to FIG. 2, there is shown a block diagram of the second embodiment of the invention 80, showing the connections to the conventional receiver 12 to provide the function of an external tuned antenna without the physical restrictions imposed by the embodiment of FIG. 1. The inventor has found that in addition to radiated emissions, the signal generated by the local oscillator in the majority of commercially produced receivers is also detectable external to the receiver cabinet as the result of conducted emissions. As indicated in the block diagram of the receiver 12 in FIG. 2, there is a conducted emission path shown by dotted line 82 from the local oscillator 26 to the antenna input terminal 16 of the receiver 12. Accordingly, the local oscillator signal can be detected by coupling the RF input terminal of the scanning receiver 38 to the tuned output terminal 62 of the tuning apparatus 80, since the terminal 62 is directly connected to the terminal 16 by the antenna cable 64. This coupling is shown in FIG. 2 by line 84 which connects the terminal 62 to the RF input of the receiver 38, thus eliminating the need for the scanning receiver antenna 40 employed in the embodiment 10. It will be appreciated that the use of the conducted emissions path eliminates the need for placement of the enclosure 34 in close promimity to the cabinet 14. In all other respects, the operation of the embodiment 80 is identical to the operation described above for the embodiment 10.

There is shown in FIG. 2 the addition of another feature of the invention, which can also be made part of the embodiment 10. This feature provides for automatic rotation of the antenna 36 about a vertical axis to further optimize reception for each station tuned by the user on the receiver 12. The operation of this feature is as follows, with reference to FIG. 2.

The antenna 36 is configured so that it is rotatable about a vertical axis relative to the enclosure 34. Antenna rotating circuits 86 are provided which communicate via cable 88 with a stepper motor (not shown) adapted to rotate the antenna 36, and with a position sensor (not shown) in the form of an optical shaft encoder or the like coupled to the motor to provide a signal indicating the relative angular position of the antenna 36 with respect to the enclosure 34. The circuits 86 are responsive to the output signal from the frequency synthesizer circuits 44 provided on line 90 and to the output signal from the signal detector circuits 48 provided on the line 92.

In operation, the user programs the rotating circuits 86 by tuning the receiver 12 to an often listened-to station, at which time the system 80 detects that station frequency and, as previously described, tunes the antenna 36 thereto. At that time, the user rotates the antenna 36 by hand turning the base 94 until optimum signal reception is achieved. The user then repeats this process by tuning to other stations and similarly rotating the antenna 36 for optimum reception at each station. Each time the receiver 12 is tuned to a new station (as sensed via the signal on the line 92), the rotating circuits 86 store in suitable memory both the frequency of the last tuned station (as sensed via the signal on the line 90), and the relative position of the antenna 36 (as sensed from the angular position transducer) corresponding to that station.

Now, whenever the user re-tunes the receiver 12 to one of these stations, the rotating circuits 86 automatically rotate the antenna 36 to an angular position corresonding to the position previously stored for that station frequency. In order for this mechanization to operate satisfactorily, the enclosure 34 must remain in a fixed angular position relative to its vertical axis, since the circuits 86 do not have an inertial reference to detect, for example, true North. The fixing of the angular position of the enclosure 34 may be facilitated by providing, for example, adhesive strips on the bottom thereof to enable the user to fasten the enclosure to a suitable base. If desired, this position-fixing requirement could be overcome by providing the circuits 86 with an inertial reference such as an electronic compass. Note that the above described mechanizations for the rotating circuits 86 are equally applicable to the embodiments 10 and 80 of the invention.

Figure 3:
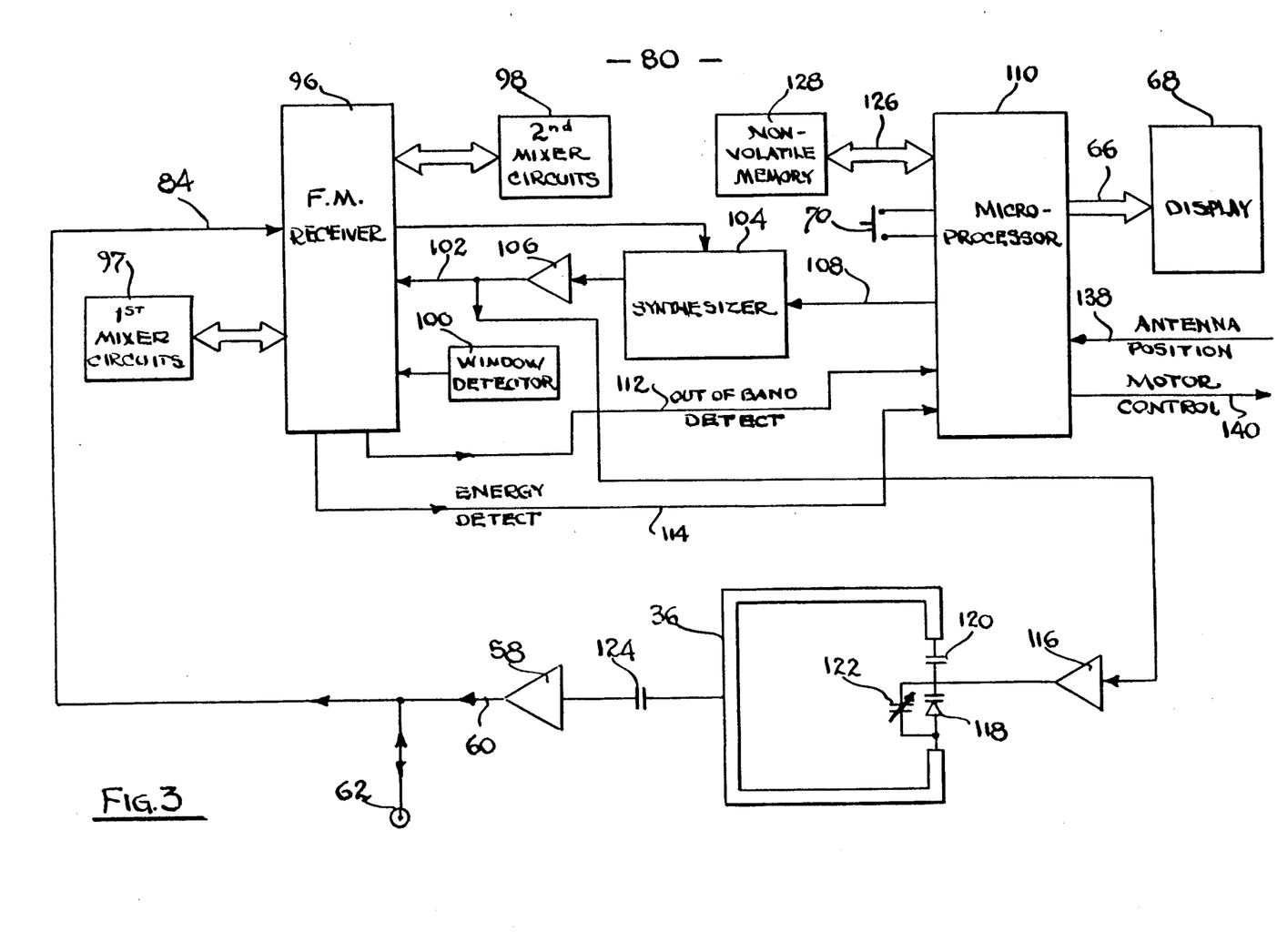
FIG. 3 is a schematic diagram showing details of circuitry used to accomplish the functions of the invention shown in FIG. 2.

Referring to FIG. 3, there is shown a schematic diagram showing a preferred implementation of the circuits for the embodiment 80 of the invention. An FM receiver 96 in the form of an integrated circuit is used in conjunction with supporting circuits to perform the functions of the scanning receiver 38. The receiver 96 which may be a type MC 3363, manufactured by Motorola Corporation, is of the dual heterodyne design, employing first and second mixer circuits 97, 98 respectively, which control the frequency of first and second internal local oscillators.

The circuits 97 and 98 are configured to provide a 10.7 Mhz first intermediate frequency, and a 455 Khz second intermediate frequency. The use of dual intermediate frequencies results in a very narrow band receiver, which is a desirable characteristic since it permits the receiver 96 to discriminate the signal from the local oscillator 26 of the receiver 12 from spurious signals. The signal from the local oscillator 26 is provided to the FM input terminal of the receiver 96 via the line 84 from the antenna terminal 62. The receiver 96 also employs window detector circuits 100 which set the bandwidth of the receiver 96 to a nominal plus and minus 10 Khz about the center frequency to which the receiver is tuned.

The frequency to which the receiver 96 is tuned is determined by a signal provided on line 102 from a frequency synthesizer 104 through a scaling amplifier 106. The signal on the line 102 represents the sum of a frequency of a station in the FM band and the I.F. frequency of the receiver 12. The synthesizer is an integrated circuit such as type LM 7001, manufactured by Sanyo Corporation, Japan. The synthesizer 104 is in turn controlled by a signal provided on line 108 from a microprocessor 110 which programs the scanning frequencies of the synthesizer 104. The microprocessor 110 is an integrated circuit such as type COP 822CN, manufactured by National Semiconductor Corporation. Each scanning frequency is chosen as the sum of a corresponding station frequency in the FM band and the I.F. frequency of the receiver 12.

Out-of-band and energy level detection signals are provided from the receiver 96 to the processor 110 on lines 112 and 114. These signals are employed by the processor to detect whether the signal being received is from the local oscillator 26. The out-of-band signal is used to determine whether the frequency of the signal received is within the bounds set by the window detector 100, and the energy level detection signal is used to determine whether the received signal is within predetermined limits of signal strength.

The signal appearing on the line 102 is also applied to a scaling amplifier 116, the output of which is used to tune the antenna 36. In essence, the amplifier 116 employs the functional relationship between the local oscillator signal frequency and the frequency to which the receiver 12 is tuned, to provide an output signal directly related to that tuned receiver frequency. This is accomplished in part by subtracting a constant value (representing the 10.7 Mhz I.F. frequency of the receiver 12) from the signal appearing on the line 102.

The antenna 36 is designed as a 6 inch by 4 inch square loop fabricated of ¼ inch wide copper tape, which yields an antenna bandwidth of about 1 Mhz. The output signal from the amplifier 116 is applied to a varactor diode 118 which is connected in series with coupling capacitor 120. This series combination is connected across the open ends of the antenna 36, whereby the antenna tuning signal from the amplifier 116 biases the varactor 118 in a manner which tunes the antenna 36 to a center frequency determined by the value of the antenna tuning signal. A variable capacitor 122 is provided to permit a factory adjustment of the antenna 36 to compensate for manufacturing tolerances to insure tracking of the antenna tuning frequency with the tuning frequency of the receiver 96.

The output signal from the antenna 36 is provided via coupling capacitor 124 to the input of the RF amplifier 58. The output of amplifier 58 is in turn connected via the line 60 to the tuned antenna output terminal 62. The amplifier 58 serves both to increase the signal level from the antenna 36 to the receiver 12 and to isolate the antenna 36 from the receiver 12 so that the signal from the local oscillator 26 is not shunted by the antenna 36.

The processor 110 is also connected via cable 66 to the display 68, and via cable 126 to non-volatile memory circuit 128. The memory circuit 128 is in the form of an integrated circuit such as type NMC 9603N, manufactured by National Semiconductor. The memory 128 is used in part to store the antenna rotation position and station frequency data discussed above.

Figure 4:
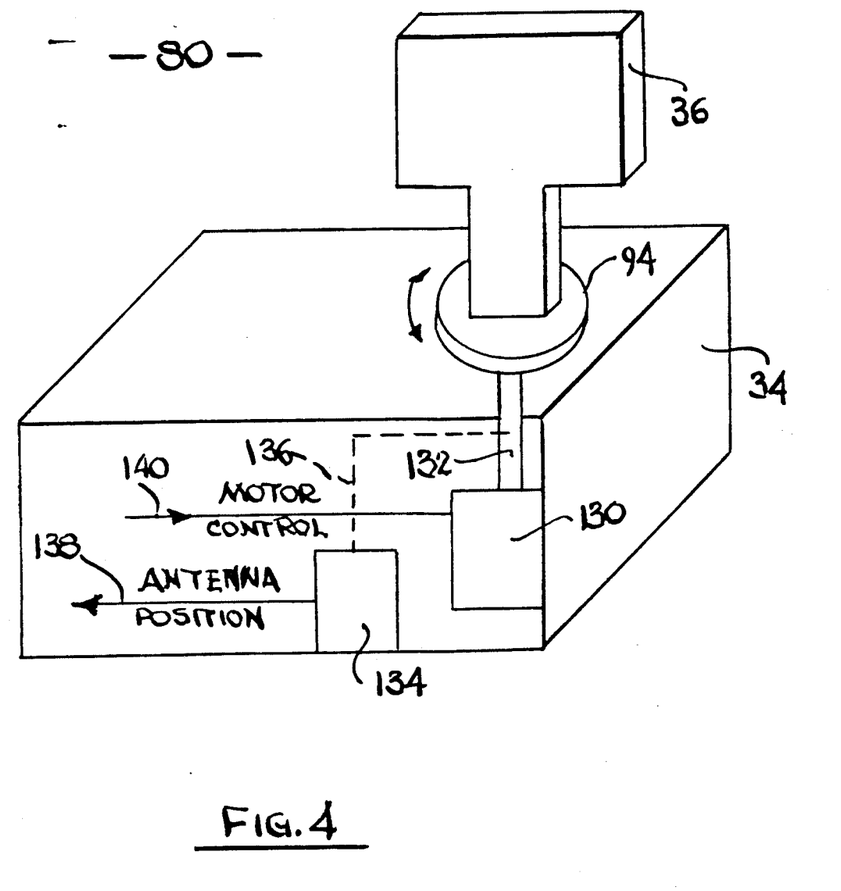
FIG. 4 is a functional block diagram showing the electromechanical elements employed in the antenna rotation portion of the invention shown in FIG. 2.

The details of the antenna rotation feature are more clearly shown in FIG. 4, taken in conjunction with FIG. 3. A motor 130 is mechanically coupled via shaft 132 to the base 94 of the rotatable antenna 36. An angular position transducer 134 is coupled via linkage 136 to the motor shaft 132 to provide angular position information on line 138 to processor 110. The motor 130 is controlled by motor control signals provided from processor 110 via line 140.

As indicated above, the antenna tuning system of the present invention includes a calibrating function to adjust the circuitry to account for variations in the actual I.F. frequency of the receiver 12 in use. The operation of that feature is as follows. Referring to FIG. 3, the calibrate switch 70 is connected to processor 110, and is used to activate the calibration procedure.

The first step in this procedure is for the user to tune the receiver 12 to a predetermined station frequency, which is chosen as 99.9 Mhz. The user then activates the switch 70, which causes the processor to tune, via the synthesizer 104, the receiver 96 to 110.55 Mhz, which corresponds to an antenna tuning frequency of 99.85 Mhz. It has been found that the I.F. frequency of commercially produced receivers 12 can vary by as much as 50 Khz from the nominal 10.7 Mhz value. Accordingly, the value of 110.55 Mhz (99.9Mhz+10.7Mhz−50Khz) is chosen to correspond to the lowest expected I.F. frequency from the receiver 12. The processor monitors the frequency of the signal from the local oscillator 26 via the line 112 from the receiver 96. If that frequency lies at or near the center of the frequency window established by the detector 100, the processor stores in the memory 128 the offset value of minus 50 Khz as a calibration factor for the receiver 12, and uses this factor to adjust the scanning frequencies produced by the synthesizer 104.

If the frequency from the oscillator 26 does not lie within the window established by the detector 100, the processor 110 increments the frequency of the receiver 96 in positive increments of 2 Khz until such window criteria is met. At that point, the processor 110 stores the offset value corresponding to that frequency, which completes the calibration for that particular receiver 12. Completion of the calibration procedure is indicated by showing a suitable message on the display 68. The procedure may be repeated when a different receiver 12 is employed with either of the embodiments 10, 80.

Figure 5:
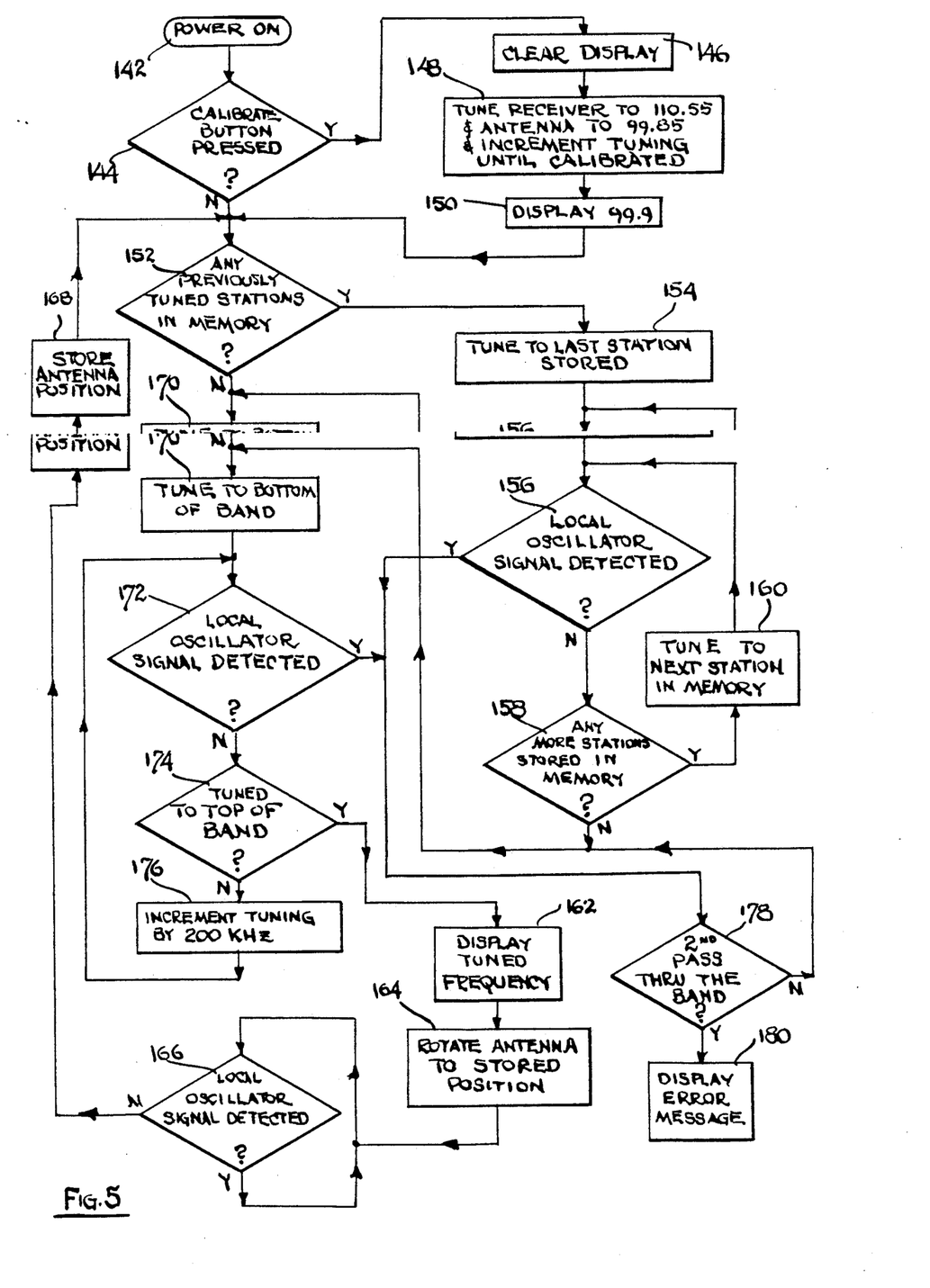
FIG. 5 is a flow chart showing the steps employed in the operation of the invention shown in FIGS. 1 and 2.

FIG. 5 is a flow chart showing the steps employed in performing the various automatic antenna tuning functions in the embodiments 10, 80. These steps may be implemented as part of a program stored in the processor 110. It is first presumed that the user has tuned his receiver 12 to a desired station. At step 142, power is applied to the circuits in the embodiments 10, 80 by use of a suitable switch. The program then moves to step 144 to determine whether the calibrate button 70 has been pressed. If it has, the program moves to step 146 to begin the calibration procedure.

At step 146, the display 68 is cleared, and at step 148 the receiver 96 is tuned to 110.55 Mhz, which corresponds to an antenna tuning frequency of 99.85 Mhz. It is presumed that the user has previously tuned the receiver 12 to the calibration frequency of 99.9 Mhz. Also at step 148, the receiver 96 is incrementally tuned in 2 Khz steps until calibration is achieved, at which point the program moves to step 150 to display the completion of calibration. Note that the calibration procedure results in a tuning frequency for the antenna 36 which is offset by the calibration factor, which can be as much as 50 Khz. Because the tuned antenna has a bandwidth of about 1 Mhz, this small offset has a negligible effect on system performance.

The program then moves to step 152, which is also the step following step 144 if calibration is not selected. At step 152, the program determines if there are any previously tuned station frequencies stored in memory. It will be recalled that the processor stores in memory both the station frequency and the relative angular position of the antenna 36 for that station for previously tuned stations.

If there are any previously stored stations, the program moves to step 154 to tune the receiver 96 to the last stored station frequency. The presumption is that the user is most likely to have selected the same sation, so that this procedure will shorten the scanning time for the system 10, 80 in finding the tuned station. From step 154, the program moves to step 156 to determine if the signal from the local oscillator 26 has been detected. If it has not, the program moves to step 158 to determine if there are any more stored station frequencies. If there are, the program tunes the receiver 96 to the next stored frequency at step 160, and checks again at step 156 to see if the local oscillator signal is detected. This procedure is repeated until either the local oscillator signal is detected or there are no more stored frequencies.

If, at one of the stored station frequencies, the local oscillator signal is detected at step 156, the program moves to step 162 where the tuned station frequency is displayed, and to step 164 where the antenna 36 is rotated to the last stored position. The program then moves to step 166 where the continued presence of the signal from local oscillator 26 is monitored. If the signal remains present, the program simply continues to loop around the step 166. If the signal is no longer present, indicating a change of station by the user or deactivation of the receiver 12, the program moves to step 168 where the last position of the antenna 36 is stored along with the frequency of the last tuned station. Accordingly, any changes made to the position of the antenna by the user are recorded before the program moves onto scan for the new station.

From step 168, the program returns to the routine described for steps 152–160. If at step 152 there are no previously tuned stations in memory, or at step 158 there are no stations stored in memory which correspond to the tuned station, the program moves to step 170, where the receiver 96 is tuned to a frequency corresponding to the lowest station frequency at the bottom of the band (88.1 Mhz). At step 172, the program determines if the signal from oscillator 26 is detected. If it is, the program moves to steps 162–168 previously described.

If the proper signal is not detected at step 172, the program moves to step 174 to determine if the frequency selected for receiver 96 corresponds to the highest station frequency at the top of the band (107.9 Mhz). If it does not, the program moves to step 176 where the tuning frequency for the receiver 96 is incremented by 200 Khz to scan the next station frequency. If this frequency is not the correct one as determined at step 172, the program continues to increment tuning frequencies at step 176 until either the correct frequency is detected at step 172, or the top of the band is reached at step 174.

If the top of the band has been reached, the program moves to step 178 to determine if this is the second scanning pass by the program through the band looking for the correct station. If it is not, the program returns to step 170 where the band is again scanned from bottom to top. If the scanning has occurred for two passes, the program stops at step 180 and displays an error message indicating that the station cannot be found. This can occur if the receiver 12 is turned off or if it is mis-tuned or if the antenna system has not been calibrated. The program may be reset by interrupting power or by use of a suitable reset button.

While the invention has been described, and preferred embodiments disclosed, it is anticipated that other modifications and adaptations will occur to those skilled in the art. It is intended therefore that the invention be limited ony by the claims appended hereto.

What is claimed is:

1. Tunable antenna apparatus for use with a tunable receiver housed within an enclosure and connectable to an external antenna by an antenna input terminal mounted on an external surface of the enclosure, the receiver being one which produces a local oscillator signal whose frequency is functionally related to the frequency to which the receiver is tuned, comprising:

local oscillator signal receiver means, external to the receiver and connected to its antenna input terminal, for receiving radio frequency emissions produced by the local oscillator signal and conducted to the antenna input terminal;

frequency determining means, responsive to the local oscillator signal receiver means, for determining the frequency of the local oscillator signal;

a tunable antenna connected to the tunable receiver antenna input terminal; and antenna tuning means, responsive to the frequency determining means, and employing the functional relationship between the local oscillator signal frequency and the frequency to which the receiver is tuned, to tune the antenna to substantially the same frequency as that to which the receiver is tuned.

2. The apparatus of claim 1 further including storage means for storing a predetermined angular position for the external antenna, and means responsive to the storage means for rotating the external antenna to an angular position corresponding to that stored value.

3. The apparatus of claim 1 in which the frequency determining means further includes calibrating means responsive to a calibration signal, for establishing the functional relationship between the local oscillator frequency and the frequency to which the receiver is tuned.

4. The apparatus of claim 1 further including display means responsive to the frequency determining means and employing the functional relationship between the local oscillator signal frequency and the frequency to which the receiver is tuned to display the frequency to which the receiver is tuned.

5. The apparatus of claim 1 further including signal isolation means for isolating the local oscillator signal receiving means from the tunable antenna.

6. A method of tuning an antenna for use with a tunable receiver housed within an enclosure connectable to an external antenna by an antenna input terminal mounted on an external surface of the enclosure, the receiver being one which produces a local oscillator signal whose frequency is functionally related to the frequency to which the receiver is tuned, comprising the steps of:

providing local oscillator signal receiving means, providing a tunable antenna,
connecting the local oscillator signal receiving means and the tunable antenna to the antenna input terminal of the receiver,
receiving, via the local oscillator signal receiving means, radio frequency emissions produced by the local oscillator signal;
determining the frequency of the local oscillator signal from the received emissions; and
tuning the antenna to substantially the same frequency as that to which the receiver is tuned in response to the frequency of the local oscillator signal by employing the functional relationship between the local oscillator signal frequency and the frequency to which the receiver is tuned.

7. The method of claim 6 in which the step of determining the frequency of the local oscillator includes the step of establishing the functional relationship between the local oscillator frequency and the frequency to which the receiver is tuned.

8. The method of claim 6 further including the steps of:
determining the frequency to which the receiver is tuned in response to the frequency of the local oscillator signal and the functional relationship between the local oscillator signal frequency and the frequency to which the receiver is tuned; and
displaying the frequency to which the receiver is tuned.

9. The method of claim 6 further including the steps of;
storing a predetermined angular position for the tunable antenna; and
rotating the tunable antenna to an angular position corresponding to the stored angular position.

10. The method of claim 6 further including the step of isolating the local oscillator signal receiving means from the tunable antenna.

* * * * *